US008250698B2

(12) United States Patent  
Gavney, Jr. et al.

(10) Patent No.: US 8,250,698 B2
(45) Date of Patent: *Aug. 28, 2012

(54) HYBRID CLEANING DEVICE INCLUDING ABSORBENT AND CONTACT ELEMENTS

(76) Inventors: James A. Gavney, Jr., Palo Alto, CA (US); Jerry Mix, Redwood City, CA (US); Jaime D. Ashander, San Francisco, CA (US)

(*) Notice: Subject to any disclaimer, the term of this patent is extended or adjusted under 35 U.S.C. 154(b) by 1164 days.

This patent is subject to a terminal disclaimer.

(21) Appl. No.: 11/701,278

(22) Filed: Jan. 31, 2007

(65) Prior Publication Data

US 2008/0115303 A1  May 22, 2008

Related U.S. Application Data

(63) Continuation-in-part of application No. 11/122,684, filed on May 4, 2005, now Pat. No. 8,141,194, which is a continuation-in-part of application No. 10/705,150, filed on Nov. 10, 2003, now abandoned.

(60) Provisional application No. 60/424,855, filed on Nov. 9, 2002, provisional application No. 60/424,856, filed on Nov. 9, 2002.

(51) Int. Cl.
  *A47L 1/06* (2006.01)
  *A47L 13/12* (2006.01)
  *A47L 13/16* (2006.01)
(52) U.S. Cl. ......................................................... 15/121
(58) Field of Classification Search ................... 15/114, 15/117, 118, 121
See application file for complete search history.

(56) References Cited

U.S. PATENT DOCUMENTS

| 66,834 | A | | 7/1867 | Harlan | |
|---|---|---|---|---|---|
| 75,421 | A | * | 3/1868 | Hayward | 15/117 |
| 104,886 | A | | 6/1870 | Rhodehamel | |
| 208,851 | A | | 10/1878 | Riffe | |
| 907,842 | A | * | 12/1908 | Meuzies | 15/114 |
| 1,191,556 | A | * | 7/1916 | Blake | 15/117 |
| 1,942,205 | A | * | 1/1934 | Elnett | 15/114 |
| 2,129,279 | A | * | 9/1938 | Kingman | 15/105 |
| 2,280,751 | A | | 4/1942 | Davis | |
| 2,334,796 | A | | 11/1943 | Steinmetz et al. | 15/121 |
| 2,516,491 | A | | 7/1950 | Swastek | 15/188 |
| 2,518,765 | A | | 8/1950 | Ecker | 15/115 |
| 2,534,086 | A | | 12/1950 | Vosbikian et al. | 15/245 |

(Continued)

FOREIGN PATENT DOCUMENTS

FR  2 636 818  3/1990

(Continued)

OTHER PUBLICATIONS

Partial machine translation of JP 6-98847, Apr. 12, 1994, 4 pages.*

*Primary Examiner* — Mark Spisich
(74) *Attorney, Agent, or Firm* — James A. Gavney, Jr.; JAG Patent Services LLC

(57) ABSTRACT

A device comprising an absorbent structure and one or more wiping elements integrated into the absorbent structure is disclosed. The absorbent structure is preferably a sponge or foam structure and the wiping elements are squeegees, nodules, or combinations thereof. In accordance with an embodiment of the invention, the wiping elements include anchor features that are embedded within the absorbent stricture.

12 Claims, 14 Drawing Sheets

U.S. PATENT DOCUMENTS

| | | | | |
|---|---|---|---|---|
| 2,587,382 | A | 2/1952 | Pyne | 15/136 |
| 2,631,326 | A | 3/1953 | Smith et al. | 15/364 |
| 2,644,974 | A | 7/1953 | Anderson | 15/121 |
| 2,678,458 | A | 5/1954 | Vosbikian et al. | |
| 2,679,063 | A * | 5/1954 | Hoffmann | 15/186 |
| 2,715,745 | A | 8/1955 | Jacobsen | 15/121 |
| 2,819,482 | A | 1/1958 | Applegate | |
| 2,880,436 | A * | 4/1959 | Hayden | 15/118 |
| 2,946,072 | A | 7/1960 | Filler et al. | 15/110 |
| 3,008,160 | A | 11/1961 | West | |
| 3,010,420 | A | 11/1961 | Glynn | |
| 3,021,649 | A * | 2/1962 | Robbins | 451/534 |
| 3,069,716 | A | 12/1962 | Smith | |
| 3,073,716 | A * | 1/1963 | Gilchrist | 427/244 |
| 3,085,267 | A | 4/1963 | Jacuzzi | |
| 3,110,052 | A | 11/1963 | Whitman | 15/117 |
| 3,181,193 | A | 5/1965 | Nobles et al. | 15/114 |
| 3,273,187 | A | 9/1966 | Williams | |
| 3,392,421 | A * | 7/1968 | Mathison | 15/104.93 |
| 3,491,396 | A | 1/1970 | Eannarino et al. | 15/104.94 |
| 3,563,233 | A | 2/1971 | Bodine | 128/36 |
| 3,631,561 | A | 1/1972 | Aszkenas | 15/250.41 |
| 3,638,270 | A | 2/1972 | Schlegel, Jr. et al. | 15/114 |
| 3,641,610 | A | 2/1972 | Lewis et al. | 15/114 |
| 3,656,202 | A | 4/1972 | Paton | 15/121 |
| 3,707,737 | A | 1/1973 | Brower | |
| 3,992,747 | A | 11/1976 | Hufton | 15/321 |
| 4,004,376 | A * | 1/1977 | Schepp et al. | 451/461 |
| 4,111,666 | A * | 9/1978 | Kalbow | 51/295 |
| 4,407,213 | A | 10/1983 | Evans | |
| 4,498,206 | A | 2/1985 | Braukmann | |
| 4,607,411 | A | 8/1986 | Lewis, Jr. | |
| 4,763,380 | A | 8/1988 | Sandvick | 15/160 |
| 4,812,070 | A | 3/1989 | Marty | 401/289 |
| 4,847,940 | A | 7/1989 | Bradbury | 15/250.4 |
| 4,913,133 | A | 4/1990 | Tichy | 128/62 |
| 5,040,260 | A | 8/1991 | Michaels | 15/167.1 |
| 5,052,840 | A | 10/1991 | St. Cyer | 401/201 |
| 5,072,480 | A * | 12/1991 | Peters et al. | 15/114 |
| 5,152,026 | A | 10/1992 | Scarpine | |
| 5,249,327 | A | 10/1993 | Hing | 15/104.94 |
| 5,289,605 | A | 3/1994 | Armbruster | 15/97.1 |
| 5,317,776 | A | 6/1994 | DeMoura | |
| 5,386,607 | A | 2/1995 | Sebor | |
| 5,429,678 | A | 7/1995 | Fany | 134/6 |
| RE35,033 | E | 9/1995 | Waldhauser | |
| 5,491,863 | A | 2/1996 | Dunn | 15/106 |
| 5,528,793 | A | 6/1996 | Schbot | 15/245 |
| 5,591,507 | A * | 1/1997 | Jones | 428/88 |
| 5,735,011 | A | 4/1998 | Asher | 15/167.1 |
| 5,881,423 | A * | 3/1999 | Shumway et al. | 15/118 |
| 6,000,088 | A | 12/1999 | Wright et al. | 15/119.2 |
| 6,003,187 | A | 12/1999 | Footer et al. | 15/119.2 |
| 6,065,182 | A | 5/2000 | Wright et al. | 15/353 |
| 6,065,890 | A | 5/2000 | Weitz | 401/146 |
| 6,092,255 | A | 7/2000 | Kim | 15/121 |
| 6,182,323 | B1 | 2/2001 | Bahten | 15/230.16 |
| 6,240,590 | B1 | 6/2001 | Nesbit | 15/210.1 |
| 6,319,332 | B1 | 11/2001 | Gavney, Jr. et al. | 134/6 |
| 6,421,867 | B1 | 7/2002 | Weihrauch | 15/28 |
| 6,463,619 | B2 | 10/2002 | Gavney, Jr. | 15/117 |
| 6,571,417 | B1 | 6/2003 | Gavney, Jr. et al. | 15/117 |
| 6,658,688 | B2 | 12/2003 | Gavney, Jr. et al. | 15/117 |
| 6,668,418 | B2 | 12/2003 | Bastien | 15/245 |
| 6,820,299 | B2 | 11/2004 | Gavney, Jr. | 15/117 |
| 6,820,300 | B2 | 11/2004 | Gavney, Jr. | 15/117 |
| 6,996,870 | B2 | 2/2006 | Hohlbein | |
| 2001/0039689 | A1 | 11/2001 | Gavney, Jr. | 15/117 |
| 2005/0049155 | A1 | 3/2005 | Gavney, Jr. et al. | 510/108 |

FOREIGN PATENT DOCUMENTS

| | | | |
|---|---|---|---|
| FR | 2733895 | * | 11/1996 |
| JP | 6-98847 | * | 4/1994 |
| JP | 6-217913 | * | 8/1994 |

* cited by examiner

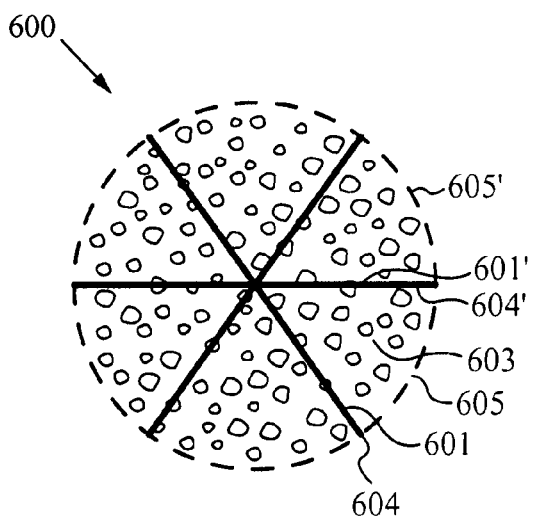
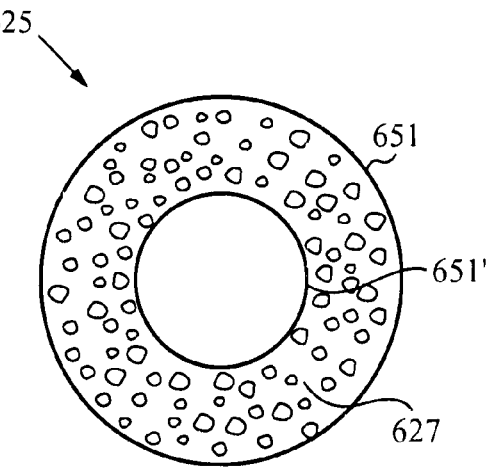
Fig. 6A                                Fig. 6B
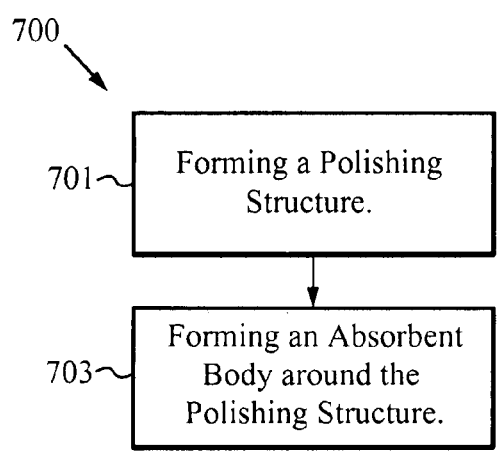
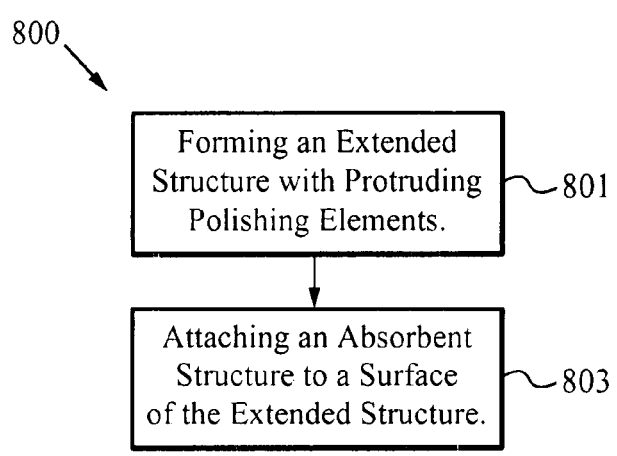
Fig. 7                                  Fig. 8

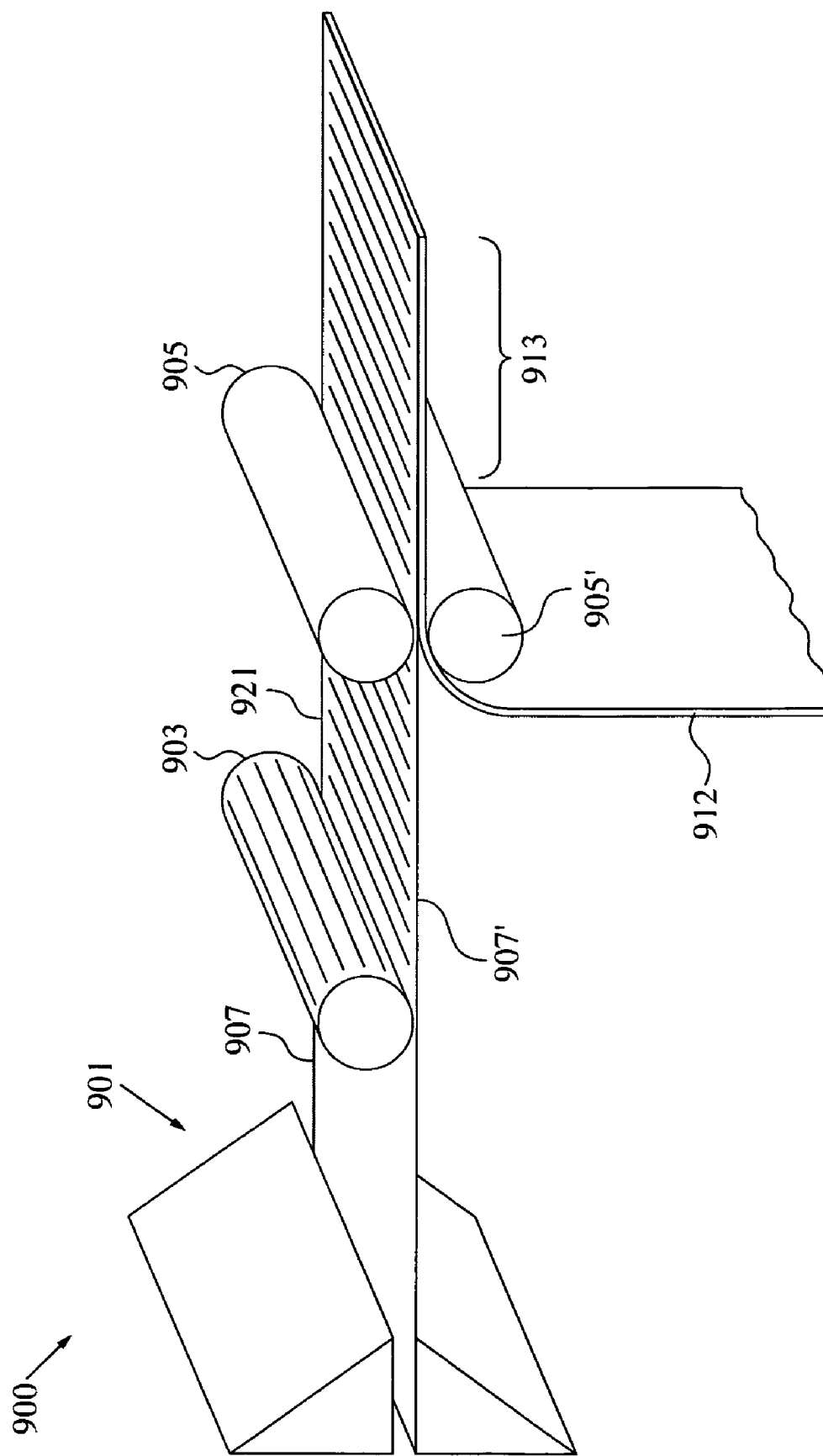

HYBRID CLEANING DEVICE INCLUDING ABSORBENT AND CONTACT ELEMENTS

RELATED APPLICATION

This patent application is a Continuation-in-Part application of the patent application Ser. No. 11/122,684, filed May 4, 2005, now U.S. Pat. No. 8,141,194, entitled "ABSORBENT STRUCTURES WITH INTEGRATED CONTACT ELEMENTS", which is a Continuation-in-Part Application of the patent application Ser. No. 10/705,150, filed Nov., 10, 2003, now abandoned, titled SQUEEGEE DEVICE AND SYSTEM", which claims priority under 35 U.S.C. 119 (e) of the U.S. Provisional Patent Application Ser. No. 60/424,855, filed Nov. 9, 2002, and titled "SQUEEGEE DEVICE AND SYSTEM" and the Provisional Patent Application Ser. No. 60/424,856, also filed Nov. 9, 2002, and also titled "SQUEEGEE DEVICE AND SYSTEM"; all of the above-listed patent applications and Provisional Patent Applications are hereby incorporated by reference in their entirety.

FIELD OF THE INVENTION

This invention relates generally to cleaning or applicator devices and systems. More specifically the invention relates to devices and systems with resilient contact elements coupled to absorbent elements for treating surfaces.

BACKGROUND OF THE INVENTION

There are many different devices available for applying materials to surfaces and/or for cleaning the surfaces. Each device is made from materials that have characteristic for a specific application or cleaning process. Brushes are often used for applying materials to surfaces or cleaning surface where scrubbing and low absorption is required. Sponges are often used for cleaning applying materials to surfaces or cleaning surface where low abrasion and a high degree of absorption is required. Scouring pads are used for applying materials to surfaces or cleaning surfaces where a high degree of abrasion is required. Squeegees are typically used to wipe materials form very smooth surfaces, such as window. While there are clearly many options of device for a particular task, many of the devices fall short of an ideal cleaning device.

SUMMARY OF THE INVENTION

Embodiments of the invention include cleaning devices and systems configured to have a contact surface that comprises multiple types of elements capable of simultaneously contacting an object during at least one mode of cleaning, and to systems and methods for producing such devices. Within the disclosure of the present invention, such devices are referred to as 'hybrid' cleaning devices. The two or more elements of a hybrid cleaning device that are configured to simultaneously contact an object during a mode of cleaning are referred to as 'cooperative' cleaning elements. Often, these elements perform different cleaning roles. Examples of cleaning roles include wiping, absorbing, retaining, abrading, and scraping. A single element can perform multiple roles, e.g. a woven abrasive pad abrading and retaining. However, a multipurpose element alone does not always constitute a hybrid cleaning device.

Elements for cleaning are considered to be different 'types' if their physical properties are substantially different in some aspect relating to their cleaning capabilities. Preferably, different types of elements are adapted to perform different cleaning roles. In the various embodiments of the present invention, this substantial difference in physical properties is due to differences in the materials used (i.e. the materials have different chemical structures), differences in the microstructure of the materials, differences in the macrostructure of the materials, or some combination of these. For example, a difference in absorbency between two cellulose-based foam elements could be due to differences in pore size and/or pore density (microstructure), while a difference in flexibility between two otherwise similar polyurethane foam elements could be due to one having apertures formed in it (macrostructure). Elements need not have homogeneous micro- or macro-structures, heterogeneously structured elements are considered.

One example of a physical property relevant to cleaning is hardness, e.g. hardness of rubber measured in Shores A, as defined in the D2240-00 Standard Test Method for Rubber Property-Durometer Hardness, published by the American Society for Testing Materials, the contents of which are hereby incorporated by reference. Another example is absorbency, e.g. capacity to absorb water measured in weight of liquid water absorbed per completely saturated unit volume at 25 degrees Celsius. In some embodiments, elements of different types according to hardness, for example, differ by 20 or more Shores A.

A device consistent with some embodiments has a contact surface comprising a first set of contact regions formed from a first material, and a second set of contact regions formed from a second material, wherein the first material and the second material are different.

A device consistent with some other embodiments of the present invention has a contact surface comprising a first set of contact regions comprising a first material with a first structure, and a second set of contact regions comprising a second material with a second structure, wherein the second set of contact regions is interspersed among the first set of contact regions and the first structure and the second structure are different.

Additional embodiments of hybrid cleaning devices are described below.

In some embodiments a hybrid cleaning device includes an absorbent element having a surface, and a wiping element coupled to the absorbent element, wherein a portion of the wiping element is configured substantially along the surface of the absorbent element to produce a contact surface of the cleaning device that includes portions of the absorbent element and of the wiping element.

In some embodiments a hybrid cleaning device includes an absorbent element, and a wiping element with a plurality of wiping elements and one or more anchor elements embedded within the absorbent element, wherein a wiping element and a portion of the absorbent element form a primary surface of the device usable for cleaning an object.

In some embodiments, wiping elements consistent with the present invention include materials and/or structures with the following characteristics: abrasive, hydrophobic, fibrous, porous, and non-porous. In some embodiments, absorbent elements consistent with the present invention include materials and/or structures with the following characteristics: hydrophilic, fibrous, porous, and woven.

In some embodiments a hybrid cleaning device includes a hydrophillic element having a first active region defining a contact surface and a first coupling region not on the contact surface, and a hydrophobic element coupled to the coupling region and having a second active region defining a wiping surface substantially tangent to the contact surface In some embodiments a hybrid cleaning device includes a hydrophillic element having a first surface, a hydrophobic element coupled to the first surface of the hydrophobic element and having a plurality of apertures formed therethrough.

In some embodiments a hybrid cleaning device includes a hydrophobic element with a contact surface, and a plurality of apertures formed therethrough, wherein the apertures are substantially perpendicular to the contact surface, and a hydrophillic element coupled to the hydrophobic element, occupying one or more of the apertures, and having a surface substantially tangent to the contact surface.

Exemplary methods of making devices consistent with the present invention are also described herein. One exemplary method includes these steps: forming a resilient structure with wiping elements and apertures, and attaching an absorbent material to a portion of the resilient structure to form a device with a contact surface comprising absorbent material and a portion of the resilient structure.

Another exemplary method includes these steps: forming a hydrophillic element having a first surface, and coupling a hydrophobic element having a plurality of apertures formed therethrough to the first surface thereby forming a contact surface comprising a surface of the hydrophobic element and a portion of the first surface.

Yet another exemplary method includes these steps: forming a hydrophobic element with a contact surface, and a plurality of apertures formed therethrough, wherein the apertures are substantially perpendicular to the contact surface, and depositing a hydrophillic material into one or more of the apertures to form a hydrophillic element coupled to the hydrophobic element having a surface substantially tangent to the contact surface.

BRIEF DESCRIPTION OF THE DRAWINGS

FIGS. 6A-6B show cross sectional views of extended resilient contact elements with an absorbent material coupled to walls of the extended resilient contact elements, in accordance with embodiments of the invention.

FIG. 7 is a block diagram outlining the steps for making a device, in accordance with embodiments of the invention.

FIG. 8 is a block diagram outlining the steps for making a device, in accordance further embodiments of the invention.

FIG. 9B shows a system for making an extended resilient element and attaching it to a surface of an absorbent layer in accordance with a method consistent with some embodiments of the invention.

DETAILED DESCRIPTION OF THE INVENTION

The embodiments of the invention described below relate to several classes of cleaning devices. These include hybrid cleaning devices and systems comprising cooperative cleaning elements, as well as systems and methods of manufacturing such devices. Further, these include dual-purpose cleaning devices and systems comprising complementary cleaning elements, as well as systems and methods of manufacturing such devices.

In the terminology of the disclosure, a "contact surface" of a cleaning device is a theoretical surface along which the cleaning device interacts with a smooth, substantially rigid, planar object during cleaning. In the case of cleaning devices comprising resilient and deformable materials, the theoretical contact surface often does not correspond to any real planar surface of the cleaning device at rest, but rather to an irregular aspect of the device capable of being deformed against a substantially rigid plane.

As described above, hybrid devices comprise multiple types of elements capable of simultaneously contacting an object along a 'hybrid contact surface' and cooperatively acting to clean the object during at least one mode of cleaning. Further, dual-purpose devices comprise multiple types of elements capable of separately contacting the object along separate contact surfaces during different modes of cleaning. The terms 'dual-purpose' and 'hybrid' aren't mutually exclusive, a single device consistent with embodiments of the present invention can be both hybrid and dual purpose. In fact, most embodiments described below are both In various embodiments of the present invention, hybrid cleaning devices include a variety of combinations of cooperative elements. These include, but aren't limited to, combinations of elements with the following primary characteristics or cleaning roles: abrasive-absorbent, hydrophillic-hydrophobic, absorbent-hydrophobic, absorbent-resilient, absorbent-textured, absorbent-structured, absorbent-woven. In addition, combinations of absorbent materials with significantly different absorbencies or other physical properties, or of resilient materials with significantly different hardness are also considered. For example, two sponge materials of differing densities can be used as cooperative cleaning elements consistent with the present invention. In general, any combination of materials having a substantially different physical property is considered.

FIGS. 1A to 1D illustrate cleaning devices that include a hybrid contact surface. The hybrid contact surface comprises cooperative cleaning elements of absorbent material and of resilient contact material. In each case, the resilient contact material is formed into elements that are positioned to extend from a planar surface of the absorbent material. The resultant surface—an absorbent plane with upstanding resilient elements—is a hybrid contact surface.

Figure 1A:
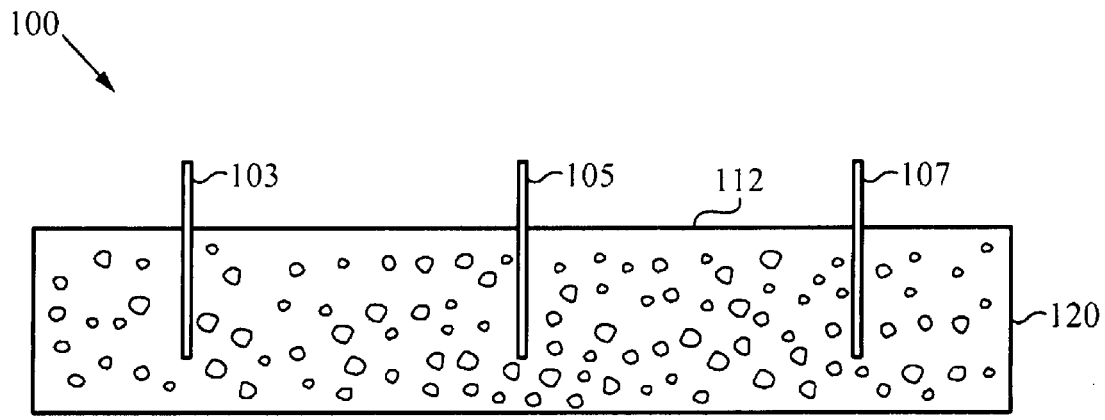
FIGS. 1A-D show cleaning devices with resilient contact elements embedded into an absorbent element in accordance with some embodiments of the invention.

FIG. 1A shows a cross-sectional view of a device 100 with a plurality of squeegee elements 103, 105 and 107 that protrude from a surface 112 of an absorbent element 120. The squeegee elements 103, 105 and 107 are embedded within the absorbent element 120 and coupled to the absorbent element 120. The upstanding portions of the squeegee elements 103, 105, and 107, and the surface of the absorbent element 120 above which they are disposed, comprise a hybrid contact surface of the device 100.

Figure 1B:
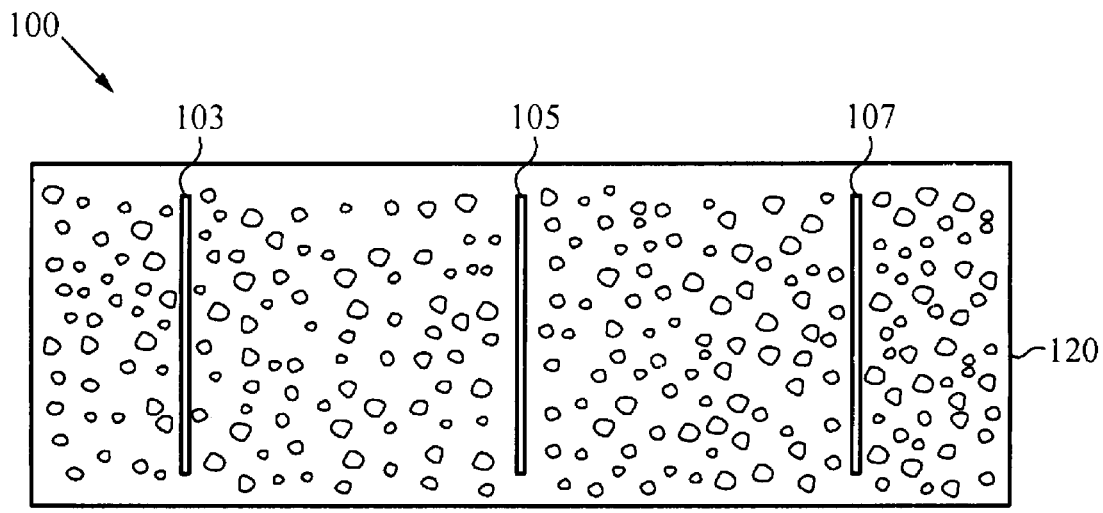

FIG. 1B shows a view of the hybrid contact surface of the device 100. The squeegee elements 103, 105 and 107 are shown as being linear, but it will be clear to one skilled in the art from the discussion above and the below that the squeegee elements 103, 105 and 107 can be curved contoured or otherwise shaped.

Figure 1C:
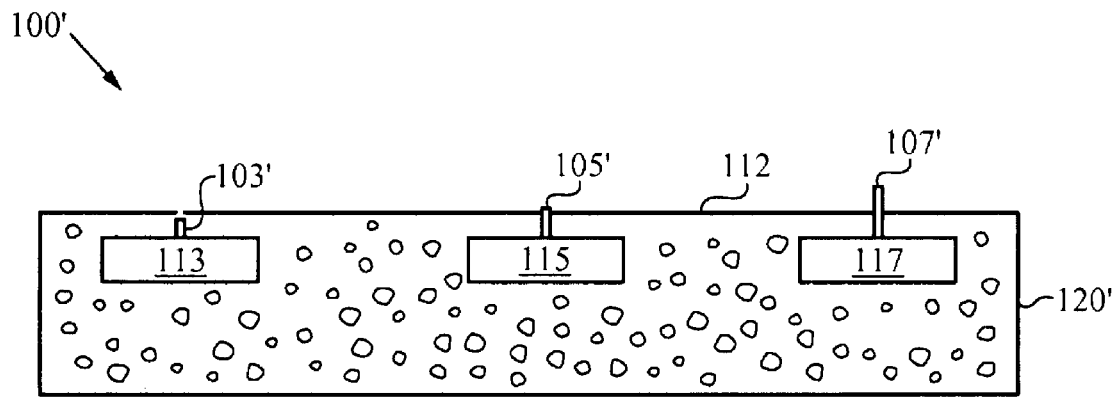

FIG. 1C shows a cross-sectional view of a device 100' consistent with an alternative embodiments of the invention. The device 100' includes a plurality of squeegee elements 103', 105' and 107' that are coupled to the absorbent element 120' through anchor features. The squeegee element 103' has a wiping edge that recedes below a surface 112 of the absorbent element 120' which can be expressed or exposed by pressing in the surface 112 of the absorbent element 120', such as, for example, during a cleaning operation. The squeegee element 105' is flush or even with the surface 112 of the absorbent element 120', and the squeegee element 107' protrudes a distance from the surface 112 of absorbent element 120'. The surface 12 and the squeegee elements 103', 105', and 107' form a hybrid contact surface of the cleaning device 100'.

It will be clear one skilled in the art that all of the squeegee elements 103', 105' and 107' can recede below the surface 112, be flush or even with the surface 12, protrude any distance or range of distances from the surface 112 or any combination thereof, so long as during cleaning these elements, or substantial portions thereof, are in contact with the object being cleaned. In each case, during cleaning, compression of the absorbent element 120', and/or deformation of the squeegee elements 103', 105', or 107', forces each of the cooperative cleaning elements against the theoretical contact plane.

Figure 1D:
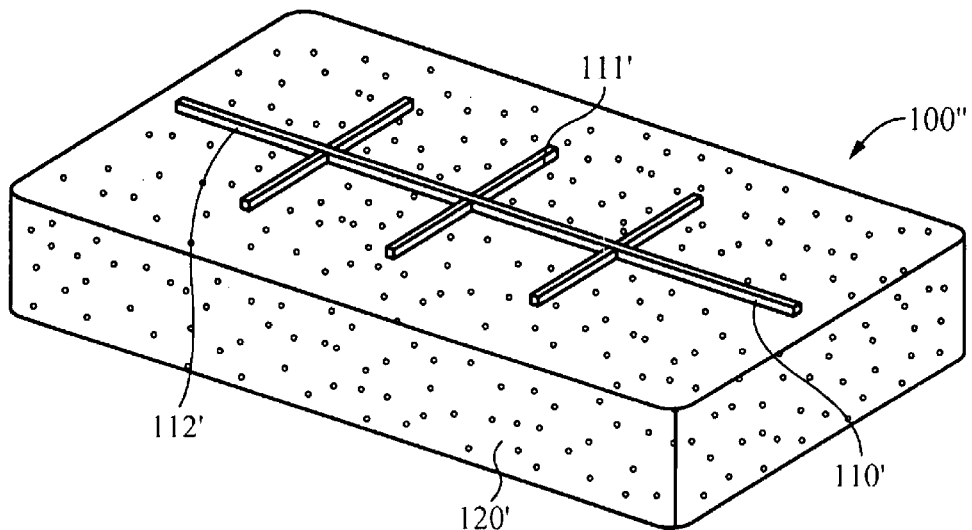

FIG. 1D shows an isometric view of a device 100" consistent with some embodiments of the invention. The device 100" includes a resilient contact element 110', which comprises longitudinally-oriented wiping elements 112' and horizontally-oriented wiping elements 111', coupled to an absorbent element 120'. In the device 100", portions of the resilient contact element 110' are embedded in the absorbent element 120', leaving the wiping elements 112' and 111' to extend slightly above a surface of the absorbent element 120'.

The surface of the absorbent element 120' forms a hybrid contact plane at which the device 100" interacts with an object being cleaned. During cleaning, the wiping elements 112' and 111' are deformed as the absorbent element 120' is pushed against the object being cleaned. The deformation of the wiping elements 112' and 111' produces a restorative strain within the resilient contact element 110', forcing the wiping elements 112' and 111' against the object being cleaned, and maintaining close contact there between. Thus, the combination of the absorbent element 120' and the resilient contact element 110' forms a cleaning device 100" that provides cooperative cleaning capabilities along a hybrid contact surface consistent with the present invention.

A wide variety of contact materials and absorbent materials are employed in embodiments consistent with FIGS. 1A to 1D. Exemplary contact materials include hydrophobic and hydrophilic synthetic polymers, and hydrophilic biopolymers. Exemplary absorbent materials include hydrophilic synthetic polymers or biopolymers structured for absorption, fibrous materials, and cloth-like materials. Preferably, the materials used, or a portion thereof, are formed from a material, or materials, that can be molded and that result in elements with hardness values in a range of 10 to 100 Shores A.

Figure 2:
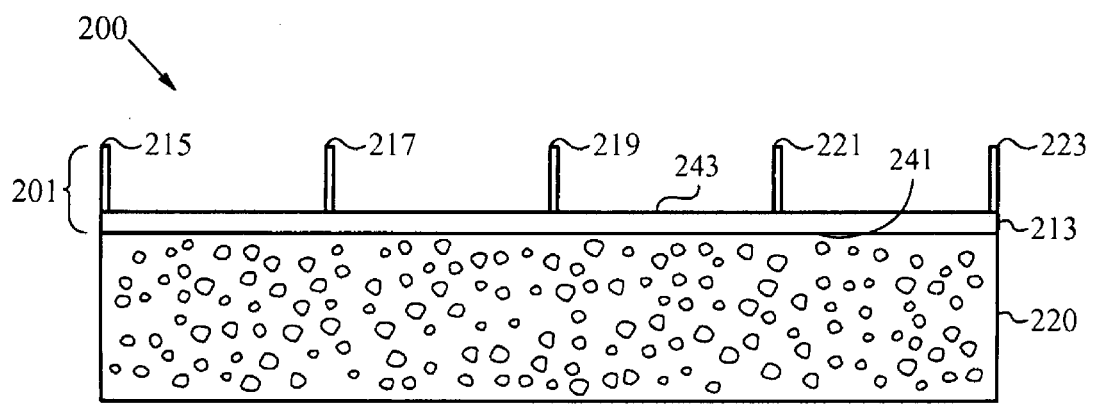
FIG. 2 shows a cross-sectional view of a cleaning device with an extended resilient contact element coupled to an absorbent element in accordance with some embodiments of the invention.

FIG. 2 shows a cross-sectional view of a device 200 with an extended resilient contact element 201. The device 200 is a dual-purpose cleaning device. The extended resilient contact element 201 disposed on one aspect of the device 200 provides a cleaning capability along that surface, while the absorbent element 220 provides a different cleaning capability along the opposite surface.

The extended resilient contact element 201 includes a sheet element 213 with a plurality of resilient contact elements 215, 217, 219, 221 and 223 protruding from a top surface 243 of the sheet element 213. The sheet element 213 also includes an inner surface 241 coupled to the absorbent element 220. The extended resilient contact element 201 can be fixed to or attached to the absorbent element 220 in any number of different ways including glues and adhesives.

Figure 3A:
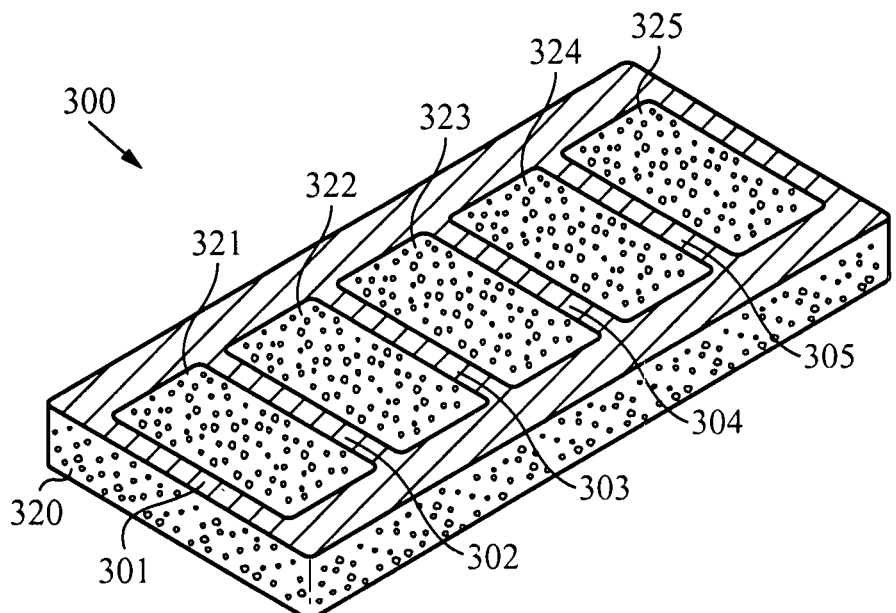
FIGS. 3A-3C show cleaning devices with contact elements coupled to absorbent elements to form a surface of alternating absorbent and contact regions in accordance with some embodiments of the invention.
Figure 3B:
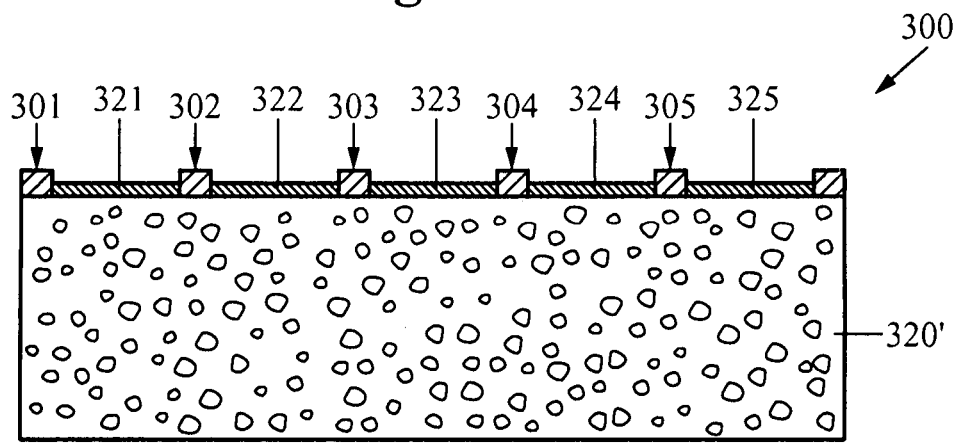
Figure 3C:
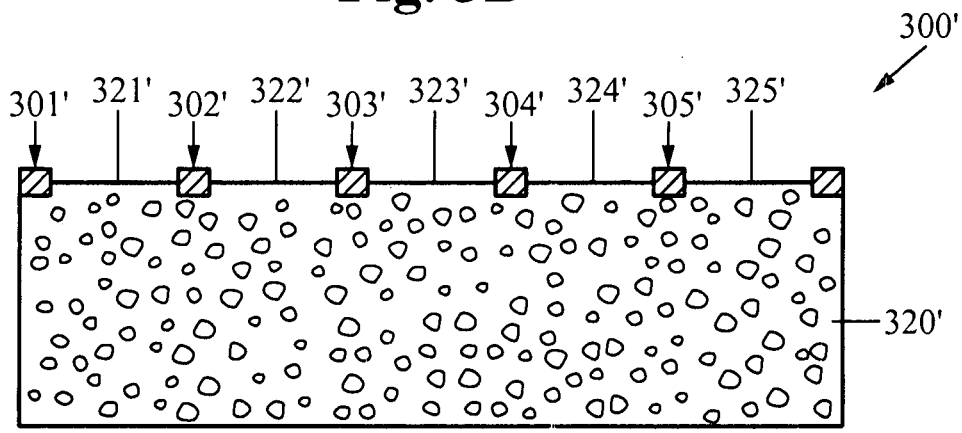

FIGS. 3A to 3C illustrate cleaning devices that include a hybrid contact surface. The hybrid contact surface comprises cooperative cleaning elements of absorbent material and of contact material. In each case, the contact material is formed into a structure that includes voids arranged along a substantially planar surface. Portions of the absorbent material are aligned with the voids within the contact material. The resultant surface—a contact plane with voids therein, and absorbent material aligned with the voids—is a hybrid contact surface.

FIG. 3A shows an isometric view of a cleaning device 300, which comprises a contact element 301, and an absorbent layer 320. A series of voids are formed within the contact element 301. The voids are separated by narrowed contact bars 302, 303, 304, and 305. Active portions 321, 322, 323, 324, and 325 of the absorbent layer 320 are aligned with the voids of the contact element 301, thereby forming a hybrid contact surface along one aspect of the device 300. The hybrid contact surface comprises varying regions of contact element 301 and absorbent layer 320. During a cleaning process that employs the hybrid contact surface of the device 300, the components of the hybrid contact surface are substantially in contact with the object being cleaned.

FIG. 3B shows a cross sectional view of the cleaning device 300. The section viewed is on or around the centerline of the hybrid contact surface's long axis. As illustrated, this portion of the hybrid contact surface of the device 300 comprises a pattern of alternating contact bars, e.g. 302, 303, 304, 305, and active portions, e.g. 321, 322, 323, 324, 325, of the absorbent layer 320. In this embodiment, the contact element 301 is coupled to a surface of the absorbent layer to produce the hybrid contact surface. As illustrated, the upper surface of the contact element 301 and the absorbent layer 320 define different planes. However, during cleaning, deformation of both the contact element 301 and the absorbent layer 320 causes elements of each to simultaneously contact the object being cleaned.

FIG. 3C shows a cross sectional view of an alternative embodiment of a cleaning device 300'. As illustrated, this portion of the hybrid contact surface of the device 300' comprises a pattern of alternating contact bars, e.g. 302', 303', 304', 305', and active portions, e.g. 321', 322', 323', 324', 325', of the absorbent element 320'. In this embodiment, the absorbent element 320' is coupled to the contact element 301' to produce the hybrid contact surface. As illustrated, the upper surface of the absorbent layer 320' lies substantially on a plane defined by an upper surface of the contact element 301'. In this embodiment, the active portions 321', 322', 323', 324', 325' of the absorbent element 320' protrude through the voids of the contact element 301'. During cleaning, deformation of both the contact element 301' and the absorbent element 320' maintains elements of each in simultaneous contact with the object being cleaned.

Figure 3D:
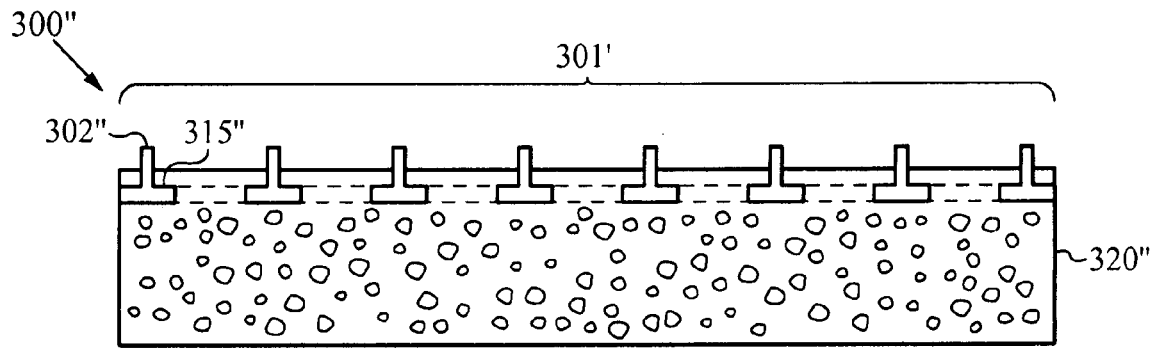
FIGS. 3D-3F show cleaning devices with contact elements embedded into an absorbent element, as well as components thereof, in accordance with some embodiments of the invention.
Figure 3E:
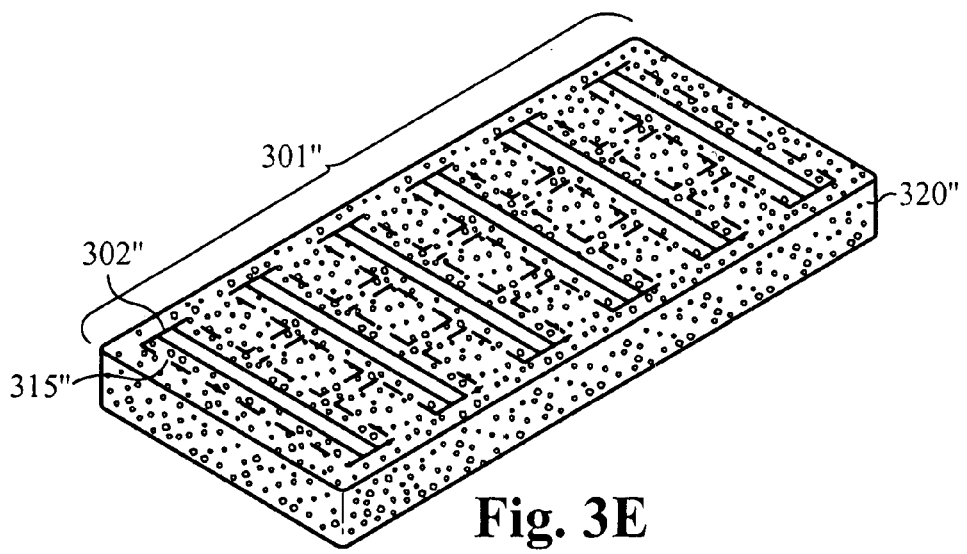
Figure 3F:
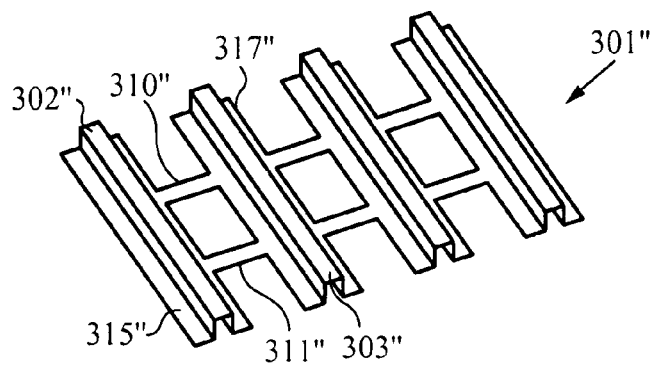

FIGS. 3D to 3F illustrate cleaning devices that include a hybrid contact surface. The hybrid contact surface comprises cooperative cleaning elements of absorbent material and of contact material. In each case, the contact material is formed into a structure that includes upstanding contact elements arranged along a substantially planar surface and supported by extended anchor elements. The absorbent material is arranged around the contact element such to form a plane substantially parallel to that defined by the upstanding contact elements, and to couple with the extended anchor elements. The resultant surface—comprising the plane defined by the contact elements, closely aligned with a plane of absorbent material—is a hybrid contact surface.

FIG. 3D shows a cross sectional view of an alternative embodiment of a cleaning device 300", which comprises a contact element 301" and an absorbent element 320". The contact element 301" comprises a series of contact bars 302", coupled to anchor elements 315", and linked together by a network of couplings (dashed lines). The section viewed is on or around the centerline of the hybrid contact surface's long axis. As illustrated, this portion of the hybrid contact surface of the device 300" comprises a pattern of alternating contact bars, e.g. 302", and absorbent material of the absorbent element 320". In this embodiment, the absorbent element 320" is coupled to a contact element 301" to produce the hybrid contact surface. As illustrated, the upper surface of the absorbent element 320" lies below a plane defined by the upper surfaces of the contact bars 302" of the contact element 301". However, during cleaning, deformation of both the contact element 301" and the absorbent element 320" causes elements of each to simultaneously contact the object being cleaned.

FIG. 3E shows an isometric view of the cleaning device 300", which comprises a contact element 301" and an absorbent element 320". The anchor elements 315" and the coupling network (other dashed lines) of the contact element 301" are embedded in the absorbent element 320" (preferably the absorbent element 320" is formed around these portions of the contact element 301"). The hybrid contact surface comprises the contact bars 302" and the upper surface of the absorbent element 320". During a cleaning process that employs the hybrid contact surface of the device 301", the substantially all of the components of the hybrid contact surface simultaneously in contact with the object being cleaned.

FIG. 3F illustrates a contact element 301" consistent with the some embodiments of the present invention. The contact element 301" comprises a series of contact bars, e.g. 302", 303", which are each coupled to anchor structures, e.g. 315", 317". The contact bar-anchor structure pairs are linked together by couplings, e.g. 310", 311", into a network. The upper surfaces of the contact bars, e.g. 302", 303", define a plane, which forms part of a contact surface of a cleaning device.

Embodiments of the present invention include a wide variety of relative orientations of contact bar surfaces and the absorbent element surface not shown in FIGS. 3D to 3F. As described earlier with reference to FIG. 1C, the contact bar surfaces can rest below, flush, or above the absorbent element surface. In each case, forces applied during cleaning processes deform the absorbent element and/or the contact element, to produce simultaneous contact between the object being cleaned, the absorbent element surface, and one or more contact surface.

Figure 4A:
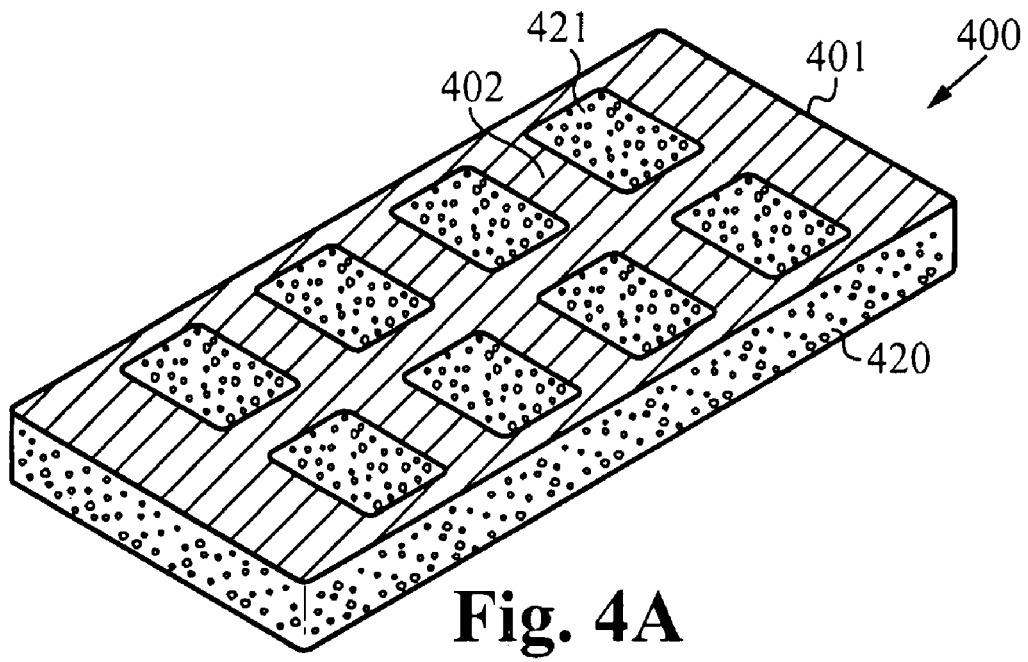
FIGS. 4A-4D show cleaning devices with contact elements coupled to an absorbent element to form a surface of alternating absorbent and contact regions in accordance with some embodiments of the invention.
Figure 4B:
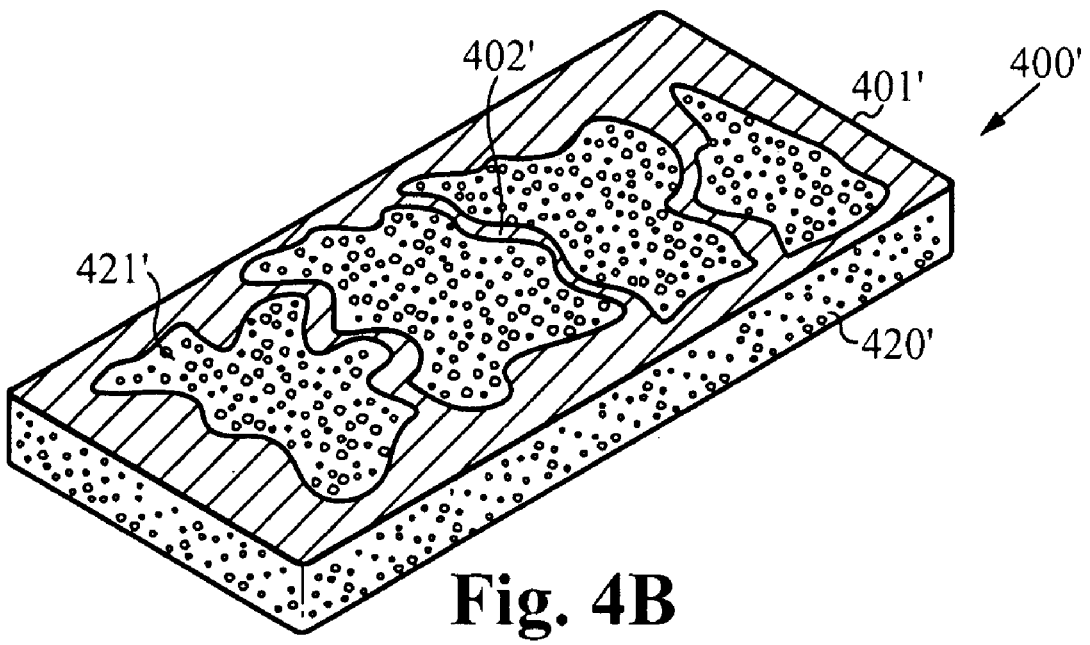
Figure 4C:
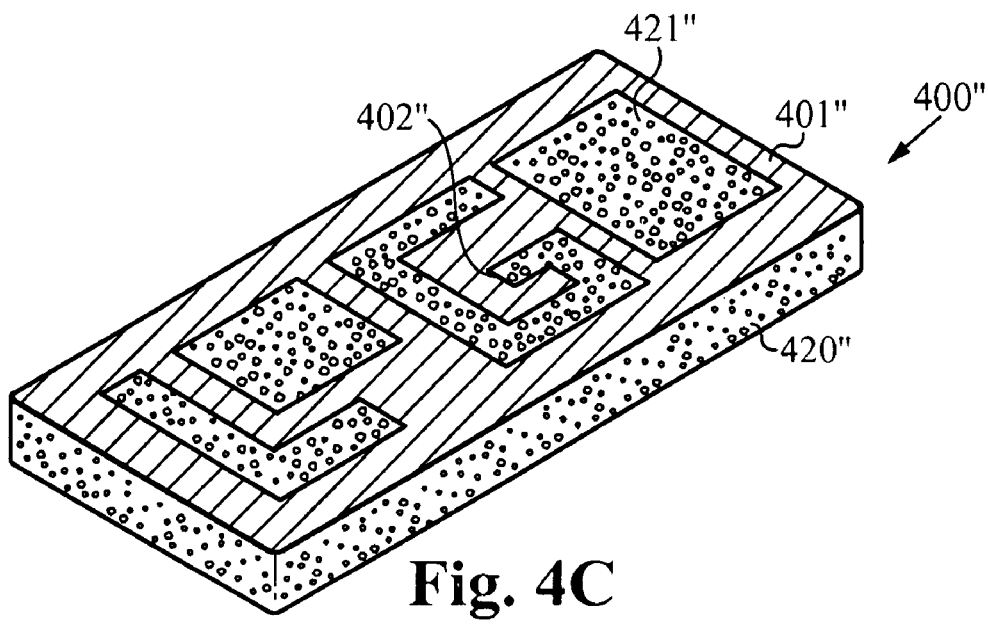
Figure 4D:
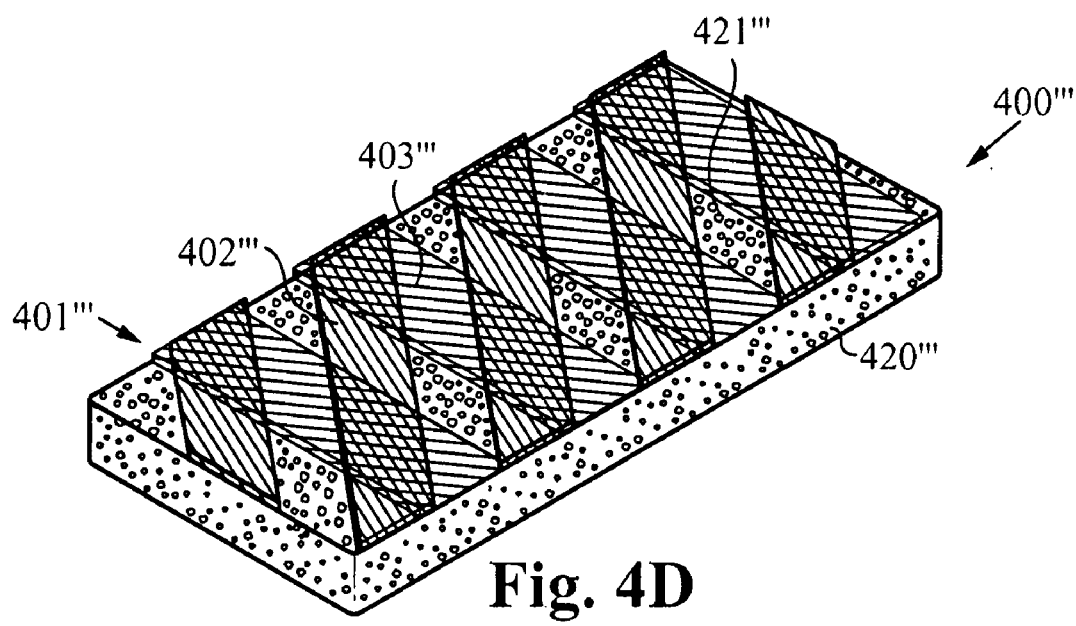

FIGS. 4A to 4C illustrate cleaning devices that include a hybrid contact surface consistent with the construction described in FIGS. 3A to 3C. FIG. 4D illustrates a device in which multiple sheets of contact material are arranged to form a complex contact element.

FIG. 4A shows an isometric view of a cleaning device 400, which comprises a contact element 401, and an absorbent layer 420. A series of voids are formed within the contact element 401. The voids are separated by contact regions 402. Active portions 421 of the absorbent layer 420 are aligned with the voids of the contact element 401, thereby forming a hybrid contact surface along one aspect of the device 400. The hybrid contact surface comprises varying regions of contact element 401 and absorbent layer 420. During a cleaning process that employs the hybrid contact surface of the device 400, the components of the hybrid contact surface are substantially in contact with the object being cleaned. In the device 400, the active regions 421 and contact regions 402 alternate with a series of rows oriented along the long axis of the hybrid contact surface.

FIG. 4B shows an isometric view of a cleaning device 400', which comprises a contact element 401', and an absorbent layer 420'. A series of voids are formed within the contact element 401'. The voids are separated by contact regions 402'. Active portions 421' of the absorbent layer 420 are aligned with the voids of the contact element 401', thereby forming a hybrid contact surface along one aspect of the device 400'. The hybrid contact surface comprises varying regions of contact element 401' and absorbent layer 420'. During a cleaning process that employs the hybrid contact surface of the device 400', the components of the hybrid contact surface are substantially in contact with the object being cleaned. In the device 400', the active regions 421' and contact regions 402' form an alternating pattern of irregular shapes on the hybrid contact surface.

FIG. 4C shows an isometric view of a cleaning device 400", which comprises a contact element 401", and an absorbent layer 420". A series of voids are formed within the contact element 401". The voids are separated by contact regions 402". Active portions 421" of the absorbent layer 420 are aligned with the voids of the contact element 401", thereby forming a hybrid contact surface along one aspect of the device 400". The hybrid contact surface comprises varying regions of contact element 401" and absorbent layer 420". During a cleaning process that employs the hybrid contact surface of the device 400", the components of the hybrid contact surface are substantially in contact with the object being cleaned. In the device 400", the active regions 421" and contact regions 402" form an alternating pattern of regular shapes on the hybrid contact surface. In the illustrated embodiment, the active regions 421" form the letters of a logo, with the contact regions forming the spaces in between.

FIG. 4D shows an isometric view of a cleaning device 400", which comprises a contact element 401", and an absorbent layer 420". The contact element 401" is a mat-like structure with a series of voids are formed therein. The voids are formed between the contact elements 402" and 403". Active portions 421" of the absorbent layer 420 are aligned with the voids of the contact element 401", thereby forming a hybrid contact surface along one aspect of the device 400". The hybrid contact surface comprises varying regions of contact element 401" and absorbent layer 420".

During a cleaning process that employs the hybrid contact surface of the device 400", the components of the hybrid contact surface are substantially in contact with the object being cleaned. In the device 400", the active regions 421" and contact regions 402" and 403" form an alternating pattern of regular shapes on the hybrid contact surface.

FIGS. 5A to 5D illustrate patterned or textured features of a contact material forming portions of hybrid contact structures consistent with some embodiments of the present invention.

Figure 5A:
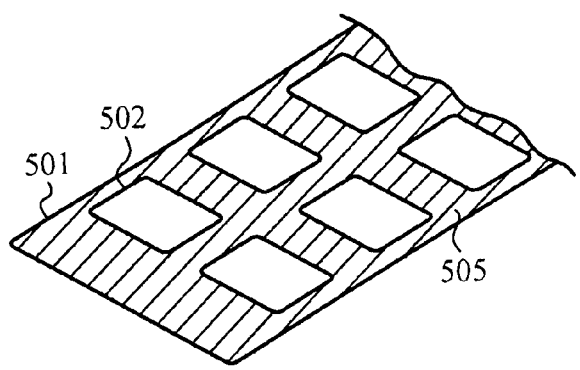
FIGS. 5A-5D show contact elements that include textured surfaces consistent with some embodiments of the present invention.

FIG. 5A illustrates a contact element 501 with a series of voids 502 formed therein. The upper surface of the contact element 501 is patterned with raised features 505. The raised features 505 provide texture to the surface of the contact element to increase cleaning efficiency.

Figure 5B:
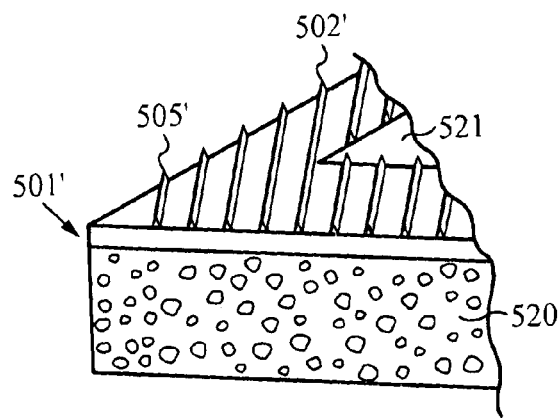

FIG. 5B is a detail view of a portion of a hybrid contact surface consistent with some embodiments of the present invention. The hybrid contact surface comprises an active portion 521 of an absorbent element 520 and an upper surface of a contact element 501'. The upper surface of the contact element 501' includes raised features, e.g. 505', 502'. The raised features 505' and 502' are parallel ridges, preferably formed integrally with the contact element 501'. Preferably the raised features 505' and 502' are resilient, and maintain pressured contact during cleaning between the contact element 501' and an object being cleaned.

Figure 5C:
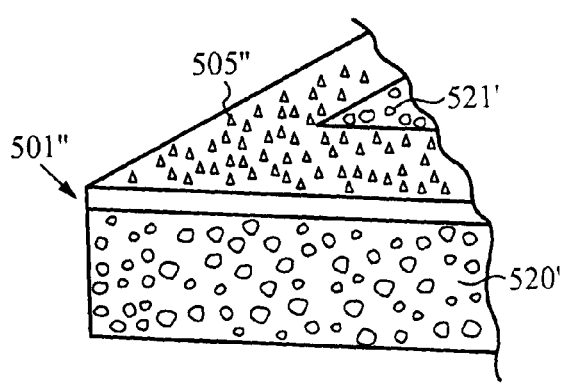

FIG. 5C is a detail view of a portion of a hybrid contact surface consistent with some embodiments of the present invention. The hybrid contact surface comprises an active portion 521' of an absorbent element 520' and an upper surface of a contact element 501". The upper surface of the contact element 501" includes raised features, e.g. 505". The raised features 505" are nubs, preferably formed integrally with the contact element 501". Preferably the raised features 505" are resilient, and maintain pressured contact during cleaning between the contact element 501" and an object being cleaned.

Figure 5D:
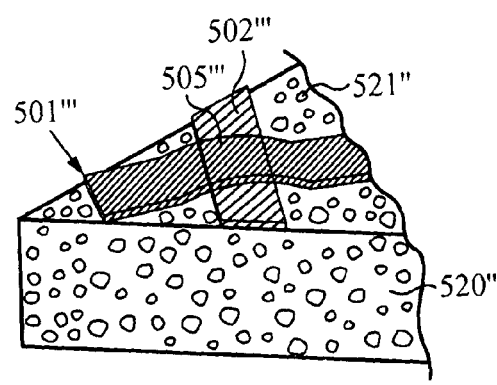

FIG. 5D is a detail view of a portion of a hybrid contact surface consistent with some embodiments of the present invention. The hybrid contact surface comprises an active portion 521" of an absorbent element 520" and an upper surface of a contact element 501". The contact element 501" comprises contact elements 502" and 505" arranged in a mat-like configuration. The upper surface of the contact element 501" includes portions of the upper surfaces of the elements 502" and 505". The mat-like configuration of the contact element 501" produces a textured contact surface. Preferably the contact elements 505" and 502" are resilient, and maintain pressured contact during cleaning between the contact element 501" and an object being cleaned.

FIGS. 6A to 6B show cross sectional views of devices 600 and 625 with absorbent materials coupled to walls of wiping elements, in accordance with embodiments of the invention. FIG. 6A shows a cross-sectional view of the device 600 with a plurality of intersecting wiping sections 601 and 601' with the absorbent material 603 attached to walls of the wiping sections 601 and 601' to provides wiping edges 604 and 604' and absorbent surfaces 605 and 605'. FIG. 6B shows a cross-sectional view of the device 625 that has tubular-shaped wiping elements 651 and 651' and the absorbent material 627 attached to or sandwiched between walls of the tubular-shaped wiping elements 651 and 651'. The wiping elements of the extended structures 600 and 625 can be readily extruded and the absorbent materials can then be blown or otherwise formed between their walls. After the extend structures 600 and 625 are formed, they can be converted or cut into smaller units and packaged.

FIG. 7 shows a block diagram 700 outlining steps for making a device, in accordance with embodiments of the invention. In the step 701a polishing structure comprising resilient wiping or contact elements, such as squeegees, nodules or a combination thereof is formed. After the polishing structure is formed in the step 701, in the step 703 an absorbent structure is formed around the polishing structure, such that a portion of the polishing structure is embedded in the absorbent structure and the polishing structure is coupled to the absorbent structure.

FIG. 8 shows a block 800 diagram outlining steps for making a device, in accordance further embodiments of the invention. In the step 801 an extended structure that includes a plurality of protruding polishing or resilient contact elements is formed. After the extended structure is formed in the step 801, in the step 803 an absorbent structure is attached to one or more surfaces of the extended structure. The extended structure can include anchor features that are embedded in the absorbent structure. Also the extended structure can be formed in sheets that are glued or otherwise attached to the absorbent structure, extruded with the absorbent material formed between walls of the extended structure, such as described previously with reference to FIGS. 6A to 6B, or any combination thereof.

Figure 9A:
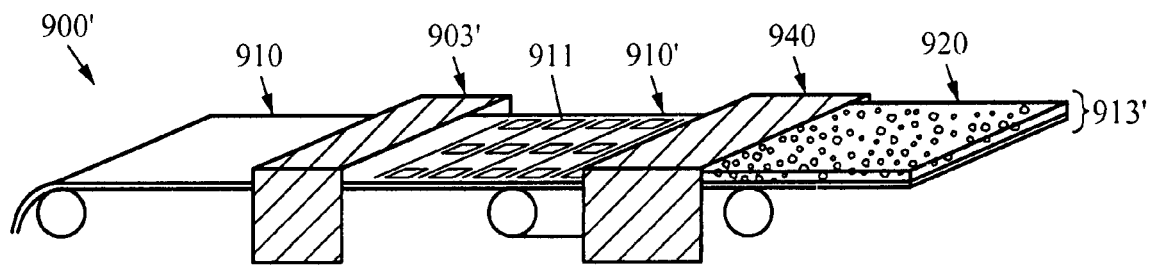
FIG. 9A shows a system for making a patterned contact element and coupling it to a surface of an absorbent layer in accordance with a method consistent with some embodiments of the invention.

FIG. 9A shows a system 900' for making a contact structure 911 and attaching absorbent material 920 to a surface of the contact structure 911, in accordance with the method of the invention. The system works with a sheet of contact material 910, which can be produced by an extruder or heater (not shown) for forming or treating the sheet of contact material 910. After the sheet of contact material 910 is formed or treated, it is patterned using any suitable patterning process to form a patterned contact structure 911. For example, as shown, the sheet of contact material 910 is passed through the cutter 903', where apertures 910' are die-cut into the sheet 910.

A layer of absorbent material 920 is then coupled to the contact structure 911 by any suitable process to form the extended layered structure 913'. One exemplary process is an adhesive process using rollers (not shown). Alternatively, as in the illustrated process, the layer of absorbent material 920 is formed directly on the contact structure 911 within the absorbent material deposition chamber 940. A variety of absorbent material deposition techniques are considered. For example, an absorbent material precursor can be deposited and then treated to form the absorbent material layer 920. The absorbent material layer 920 is coupled to the contact structure 911 by some combination of physical and/or chemical structures either inherent in the deposition process or due to specific steps included in the process to promote coupling. In some embodiments, the contact structure 911 includes anchor features (not shown).

As shown, the extended layered structure 913' is formed as an extended sheet. The bottom face of the extended layered structure 913' is a hybrid contact surface comprising the bottom surface of the contact structure 911 and portions of the absorbent layer 920 aligned with the apertures 910' of the contact structure 911. The extended layered structure 913' can be converted or cut into smaller units, each with a hybrid contact surface.

FIG. 9B shows a system 900 for making an extended resilient structure 907' and attaching absorbent material 912 to a surface of the extended resilient structure 907', in accordance with the method of the invention. The system 900 can include an extruder or heater 901 for forming or treating a sheet of resilient material 907. After the sheet of resilient material 907 is formed or treated, the sheet of resilient material 907 is patterned using any suitable patterning process to form a patterned surface 921 with resilient contact elements. For example, the sheet of resilient material 907 is embossed using an embossing roller 903 to form the extended resilient structure 907' with the patterned surface 921. A layer or absorbent material 912 is then attached to the extend resilient structure 907' by any suitable process, such as an adhesive process using rollers 905 and 905' to form the extended structure 913 that includes a layer of the extended resilient structure 907' and a layer of the absorbent structure 912. The extend structure 913 can then be converted or cut into smaller units and packaged. As described above, and alternatively gluing the absorbent layer 912 onto the extended resilient structure 907', the absorbent layer 912 can be formed directly on a surface of the extended resilient structure 907', which can include anchor features (not shown).

Figure 9C:
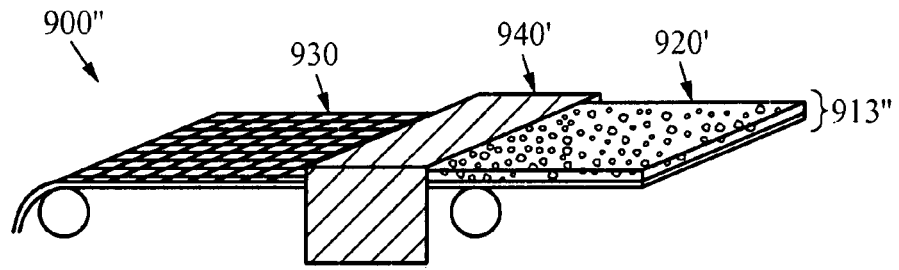
FIG. 9C shows a system for making a contact element and embedding it in an absorbent layer in accordance with a method consistent with some embodiments of the invention.

FIG. 9C shows a system 900" for attaching absorbent material 920' to a surface of a contact structure 930, in accordance with the method of the invention. The system works a contact structure 930, which is preferably a mat-like structure, to which a layer of absorbent material 920' is coupled.

The contact structure 930 is preferably a mat-like structure comprising a series of apertures. In the illustrated embodiment, the contact structure is formed of a network of linked vertical walls. Preferably the walls are of sufficient height to provide an anchor surface for coupling to the absorbent material 920'. In some embodiments, the contact structure has a complexity to its structure along the vertical axis, e.g. a structure formed of multiple layers of material with over-lapping aperture patterns.

The coupling between the contact structure 930 the absorbent material 920' occurs by any suitable process and forms the extended layered structure 913". One exemplary process is an adhesive process using rollers (not shown). Alternatively, as in the illustrated process, the layer of absorbent material 920' is formed directly on the contact structure 930 within the absorbent material deposition chamber 940'. A variety of absorbent material deposition techniques are considered. For example, an absorbent material precursor can be deposited and then treated to form the absorbent material layer 920'. The absorbent material layer 920' is coupled to the contact structure 930 by some combination of physical and/or chemical structures either inherent in the deposition process or due to specific steps included in the process to promote coupling. In some embodiments, the contact structure 930 includes anchor features (not shown).

As shown, the extended layered structure 913" is formed as an extended sheet. The bottom face of the extended layered structure 913" is a hybrid contact surface comprising the bottom surface of the contact structure 930 and portions of the absorbent layer 920' aligned with the apertures within the contact structure 930. The extended layered structure 913" can be converted or cut into smaller units, each with a hybrid contact surface.

Figure 10:
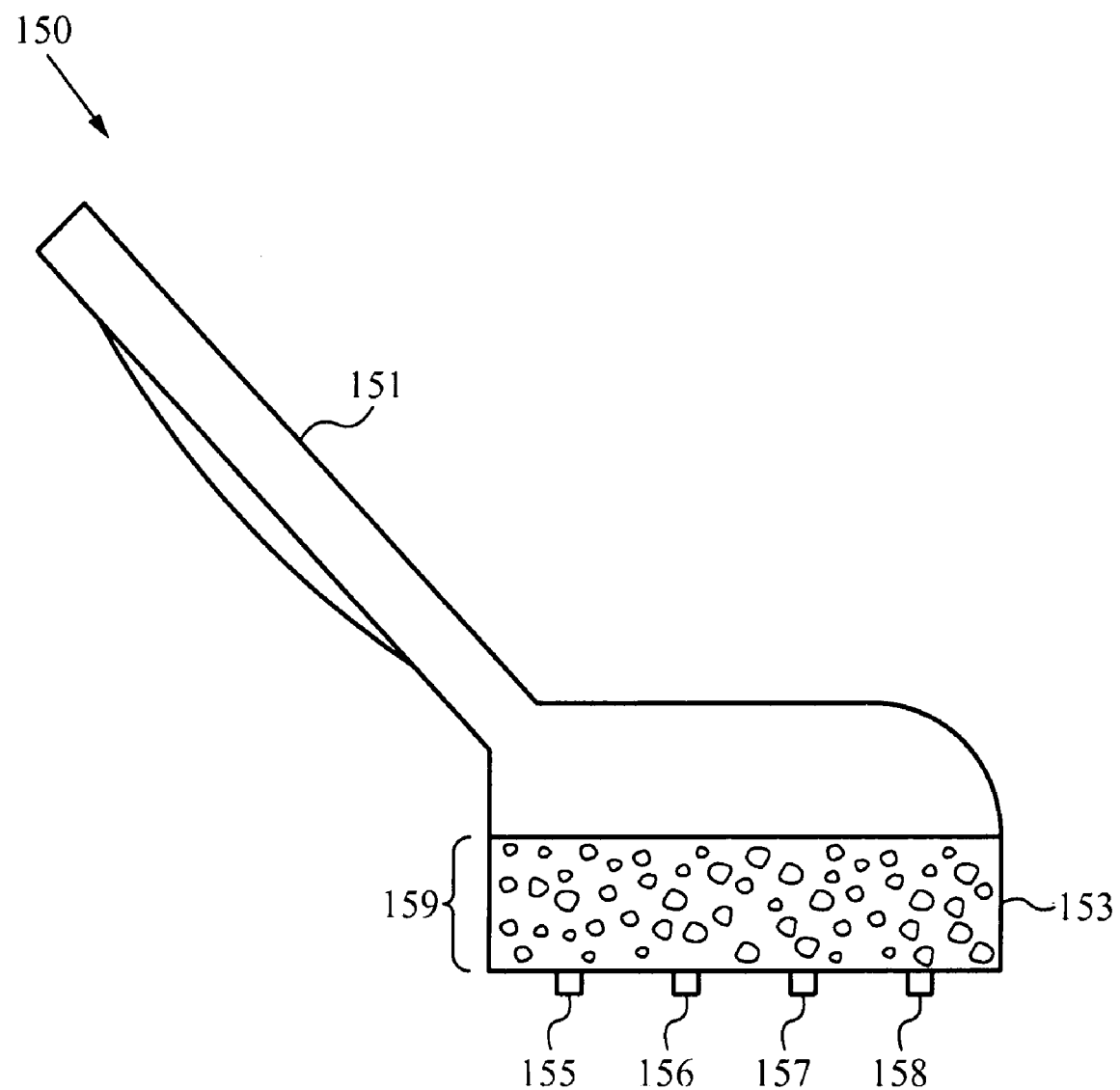
FIG. 10 shows a manual scrubber with resilient contact elements integrated into an absorbent element, in accordance with the embodiments of the invention.

FIG. 10 shows a scrubber device 150 with a applicator head 159. The applicator head 159 includes resilient contact elements 155, 156, 157 and 158 that are integrated into an absorbent structure 153, such a described above. The resilient contact elements 155, 156, 157 and 158 are squeegee, nodules or any combination thereof. The resilient contact elements 155, 156, 157 and 158 are integrated into the absorbent structure 153 using any one or more of the method described above. The scrubber device 150 can include a handle section 151 that is configured to detachably couple to the applicator head 159, such that the applicator head 159 can be readily replaced and the handle 151 can be reused.

Figure 11:
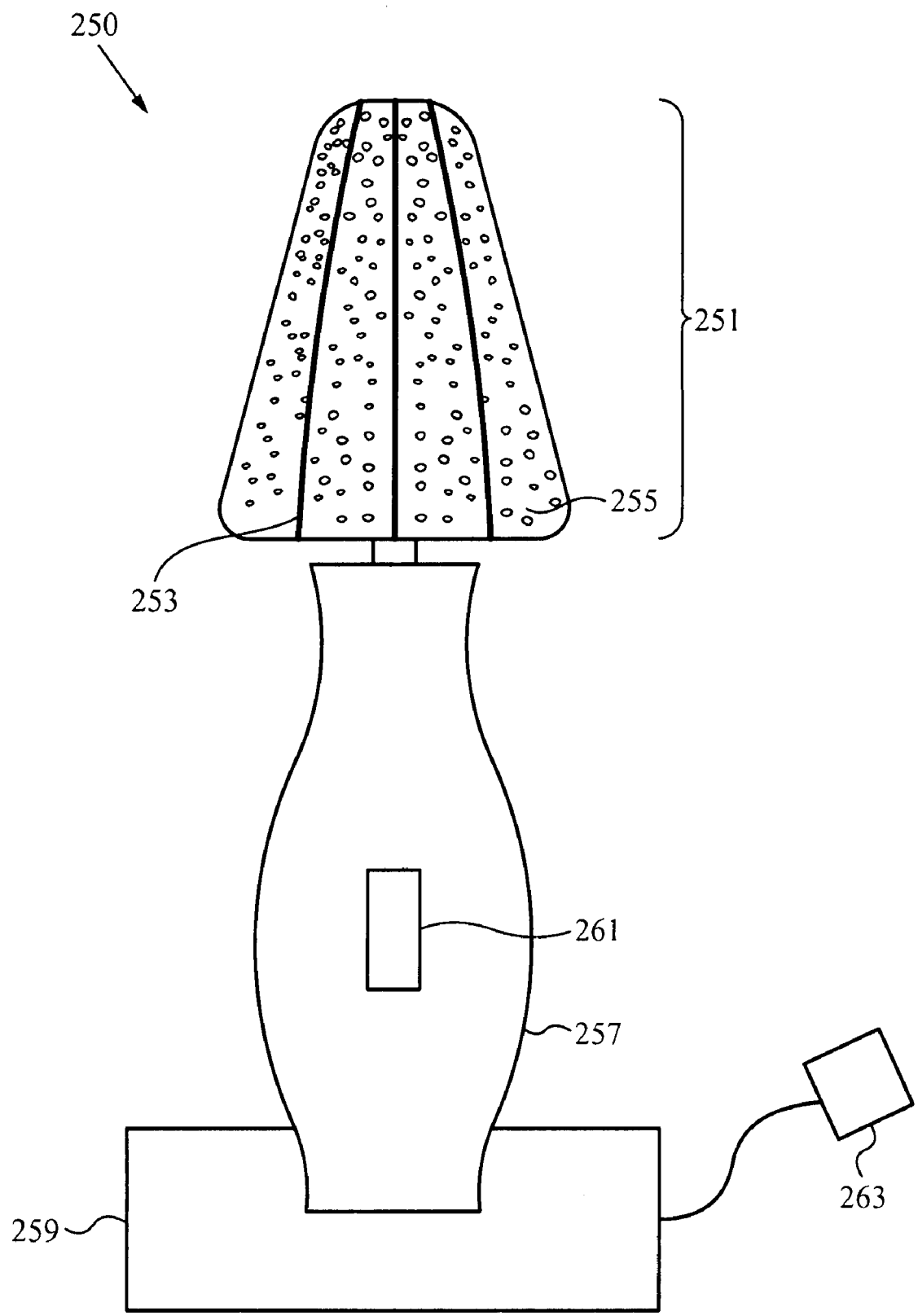
FIG. 11 shows a electric scrubbier with resilient contact elements integrated with absorbent elements, in accordance with the embodiments of the invention.

FIG. 11 shows a electric scrubber 250 with a power head 251 that spins, oscillates or otherwise moves. The power head 251 includes resilient contact elements 253 integrated with absorbent structures 255. The electric scrubber 250 also includes a motorized handle 257 that can be configured to detachably couple to the power head 251. The motorized handle 257 can include a switch 261 for adjusting and/or initiating movement of the power head 251. The electric scrubber 250 can also include a recharging cradle or stand 259 that couples to a power source 263 for recharging a battery (not show) contained within the motorized handle 257.

Figure 12:
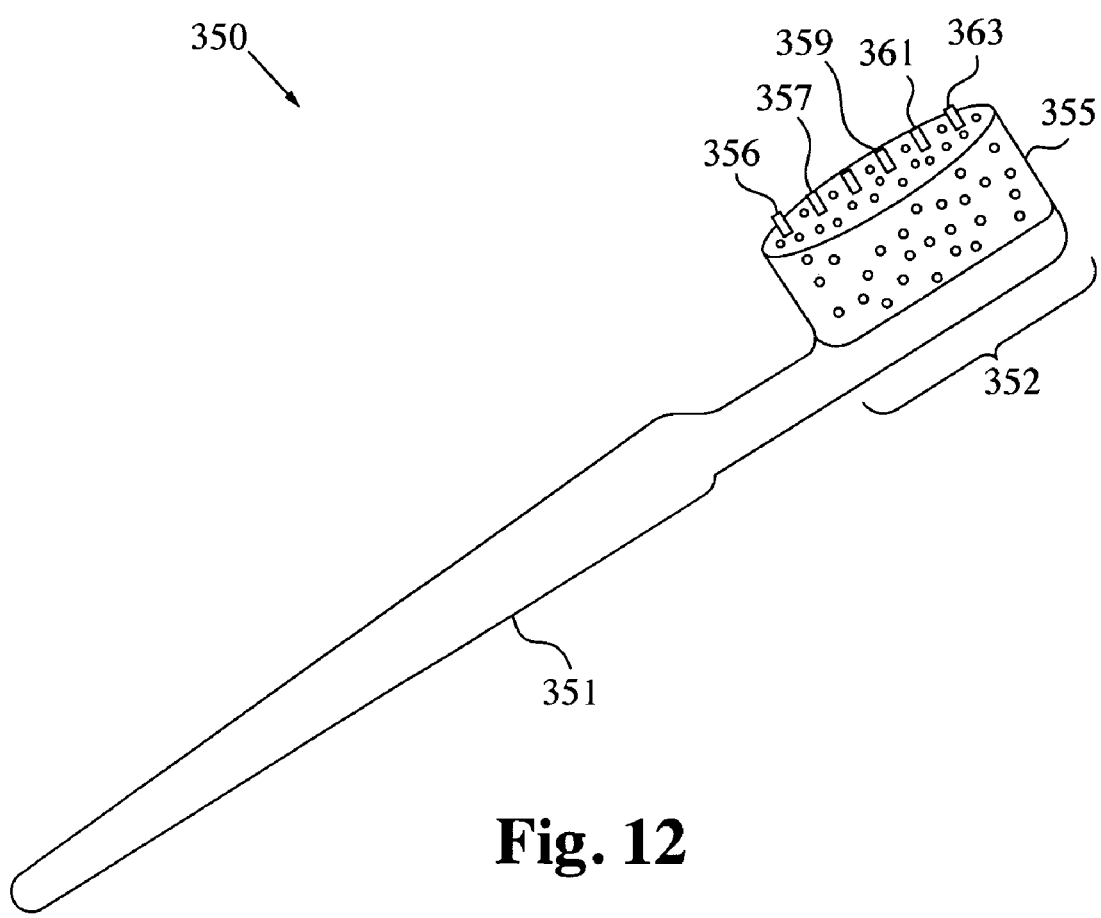
FIG. 12 shows a manual toothbrush, in accordance with the embodiments of the invention.

FIG. 12 shows a manual toothbrush 350 that includes an applicator head 352 with a plurality of resilient contact elements 356, 357, 369, 361 and 363 integrated into an absorbent structure 355, in accordance with the embodiments of the invention. The applicator head 352 is preferably coupled to a handle 351, which can be made to detachably couple to the applicator head.

Figure 13:
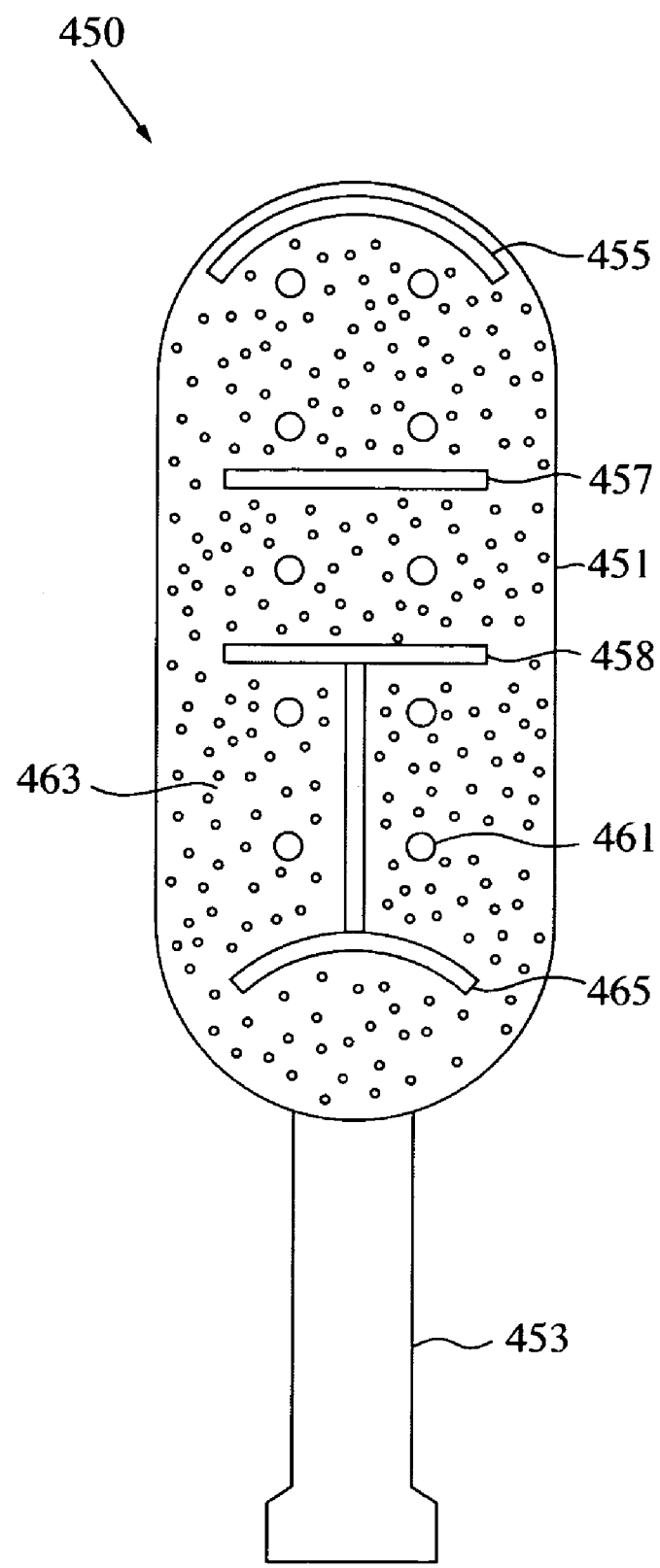
FIG. 13 shows a detachable applicator head, in accordance with the embodiments of the invention.

FIG. 13 shows detachable applicator head 450, in accordance with the embodiments of the invention. The applicator head 450 includes one or more curved squeegees 455 and 465, linear squeegees 457 and 458 or any combination thereof. The applicator head 450 can also include nodules and/or bristle sections 461. The squeegees 455, 465, 457, 458 and the nodules or bristle sections 461 can be integrated with an absorbent structure 463 through one or more anchor features such as described above. The applicator head 450 can also include a neck or shaft 453 configured to detachably couple to a manual handle, a motorized handle and/or a liquid or solution source (not shown). The neck or shaft 453 can be hollow such that a liquid or solution from the liquid or solution source can flow to the absorbent structure 451 through the neck or shaft 453, where the liquid or solution can be applied to a surface.

It will be clear to one skilled in the art from the description above that resilient contact elements described can be contoured, to corrugated, curved, pointed, angled, tapered or otherwise textured. Devices and system in addition resilient contact elements and absorbent structure can also include bristles. Further, any number of the features described above can be combined in different ways to provide other applicator configurations that are considered to be within the scope of the invention. It is also understood that an abrasive material can be integrated into the resilient contact elements. Further, the absorbent elements utilized in the applicators configurations of the present invention can be formed from systematic materials, such as polyurethane, plastics, rubber other polymeric materials, natural materials, such as natural sponge, woven materials, such as cotton and/or other woven materials. The scouring or abrasive elements utilized in the squeegee configuration can be formed from metal, plastic, composite materials or any combination thereof. Accordingly, the proceeding preferred embodiments of the invention is set forth without any loss of generality to, and without imposing limitations upon, the claimed invention.

What is claimed is:

1. A device with a contact surface comprising:
   a. a first set of contact regions formed from a first material; and
   b. a second set of contact regions formed from a second material, wherein the first material and the second material are different, wherein the first set of contact regions include a plurality of elongated squeegee wiping structures with opposed walls extending from anchor features to form wiping edges, wherein the anchor features and at least portions of the opposed walls are embedded within the second material such that the wiping edges are configured to simultaneously wipe a surface through the contact surface.

2. The device of claim 1, wherein the first set of contact regions and the second set of contact regions are interspersed along the contact surface.

3. The device of claim 1, wherein the first set of contact regions and the second set of contact regions have a different macrostructure.

4. A device with a contact surface comprising:
   a. a first set of contact regions comprising a plurality of elongated squeegee wiping elements formed from a first material; and
   b. a second set of contact regions comprising absorbent elements formed from a second material, wherein the elongated squeegee wiping elements have elongated opposed walls that form wiping edges and wherein portions of each of the elongated opposed walls are embedded within the second material through anchor features.

5. A cleaning device comprising:
   a. a structure having a substantially planar surface formed from an absorbent material; and
   b. non-absorbent elongated wiping elements extending along the substantially planar surface, such that each of the non-absorbent elongated wiping elements are surrounded by portions of the absorbent material of the substantially planar surface.

6. The device of claim 5, wherein the elongated wiping elements are squeegees.

7. The device of claim 5, wherein at least a portion of the elongated wiping elements are curved.

8. The device of claim 5, wherein the absorbent material is sponge or foam material.

9. A device with a substantially planar hybrid contact surface comprising:
   a. a porous absorbent material; and
   b. a non-absorbent wiping structure with a plurality of wiping elements having opposed elongated walls, wherein the wiping structure is attached to the porous absorbent material, such that the porous absorbent material of the substantially planar hybrid contact surface surround the opposed elongated walls.

10. The device of claim 9, wherein a portion of the wiping elements protrude from the substantially planar surface of the absorbent material.

11. The device of claim 9, wherein a portion of the wiping elements recede within the substantially planar surface of the absorbent material.

12. A device comprising:
   a) an absorbent structure formed from a porous sponge or foam material; and
   b) a plurality of elongated wiping structures formed from a non-porous rubber, plastic or polymer with opposed elongated walls extending from a substantially planar surface of the absorbent structure, such that each of the plurality of elongated wiping structures are surrounded by portions of the porous sponge or the foam material of the substantially planar surface.

* * * * *